(12) United States Patent
Ripley

(10) Patent No.: US 9,929,694 B2
(45) Date of Patent: Mar. 27, 2018

(54) SCHOTTKY ENHANCED BIAS CIRCUIT

(71) Applicant: Skyworks Solutions, Inc., Woburn, MA (US)

(72) Inventor: David Steven Ripley, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/868,981

(22) Filed: Sep. 29, 2015

(65) Prior Publication Data

US 2016/0094184 A1  Mar. 31, 2016

Related U.S. Application Data

(60) Provisional application No. 62/057,485, filed on Sep. 30, 2014.

(51) Int. Cl.
| | | |
|---|---|---|
| *H03H 3/04* | (2006.01) | |
| *H03F 1/02* | (2006.01) | |
| *H03F 3/19* | (2006.01) | |
| *H03F 3/24* | (2006.01) | |
| *H03F 1/30* | (2006.01) | |
| *H03F 3/04* | (2006.01) | |

(52) U.S. Cl.
CPC ......... *H03F 1/0222* (2013.01); *H03F 1/0266* (2013.01); *H03F 3/19* (2013.01); *H03F 3/245* (2013.01); *H03F 1/301* (2013.01); *H03F 1/302* (2013.01); *H03F 3/04* (2013.01); *H03F 2200/102* (2013.01); *H03F 2200/108* (2013.01); *H03F 2200/18* (2013.01); *H03F 2200/451* (2013.01); *H03F 2200/513* (2013.01); *H03F 2200/555* (2013.01)

(58) Field of Classification Search
CPC ..................................................... H03F 1/0222
USPC .................................. 330/296, 285, 288, 136
See application file for complete search history.

(56) References Cited

U.S. PATENT DOCUMENTS 5,812,013 A * 9/1998 Schatz ................... G11C 17/18
                                                      327/427

* cited by examiner

*Primary Examiner* — Khanh V Nguyen
*Assistant Examiner* — Khiem Nguyen
(74) *Attorney, Agent, or Firm* — Knobbe, Martens, Olson & Bear, LLP

(57) ABSTRACT

Embodiments disclosed herein relate to a bias circuit that uses Schottky diodes. Typically, a bias circuit will include a number of transistors used to generate a bias voltage or a bias current for a power amplifier. Many wireless devices include power amplifiers to facilitate processing signals for transmission and/or received signals. By substituting the bias circuit design with a design that utilizes Schottky diodes, the required battery voltage of the bias circuit may be reduced enabling the use of lower voltage power supplies.

16 Claims, 11 Drawing Sheets

SCHOTTKY ENHANCED BIAS CIRCUIT

RELATED APPLICATIONS

This disclosure claims priority to U.S. Provisional Application No. 62/057,485, which was filed on Sep. 30, 2014 and is titled "SCHOTTKY ENHANCED BIAS CIRCUIT," the disclosure of which is expressly incorporated by reference herein in its entirety.

BACKGROUND

Technical Field

The disclosed technology relates to bias circuits and, in particular, a bias circuit for a power amplifier.

Description of Related Technology

Many devices incorporate one or more power amplifiers. A power amplifier enables a signal to be amplified by adjusting the voltage of the signal. Often, the amplification or gain factor is constrained by a power supply voltage.

Typically, a power amplifier will be preceded by a bias circuit. The bias circuit can be used to set an operating voltage or current for the power amplifier. It is often desirable for the biasing to be wide bandwidth in nature. One potential issue that arises in biasing the power amplifier is that radio frequency (RF) energy tends to leak onto the line or circuit connection between the bias circuit and the power amplifier. This is often a disadvantage because it can cause the bias to shift and can degrade the performance of the bias circuit.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

SUMMARY

Figure 1:
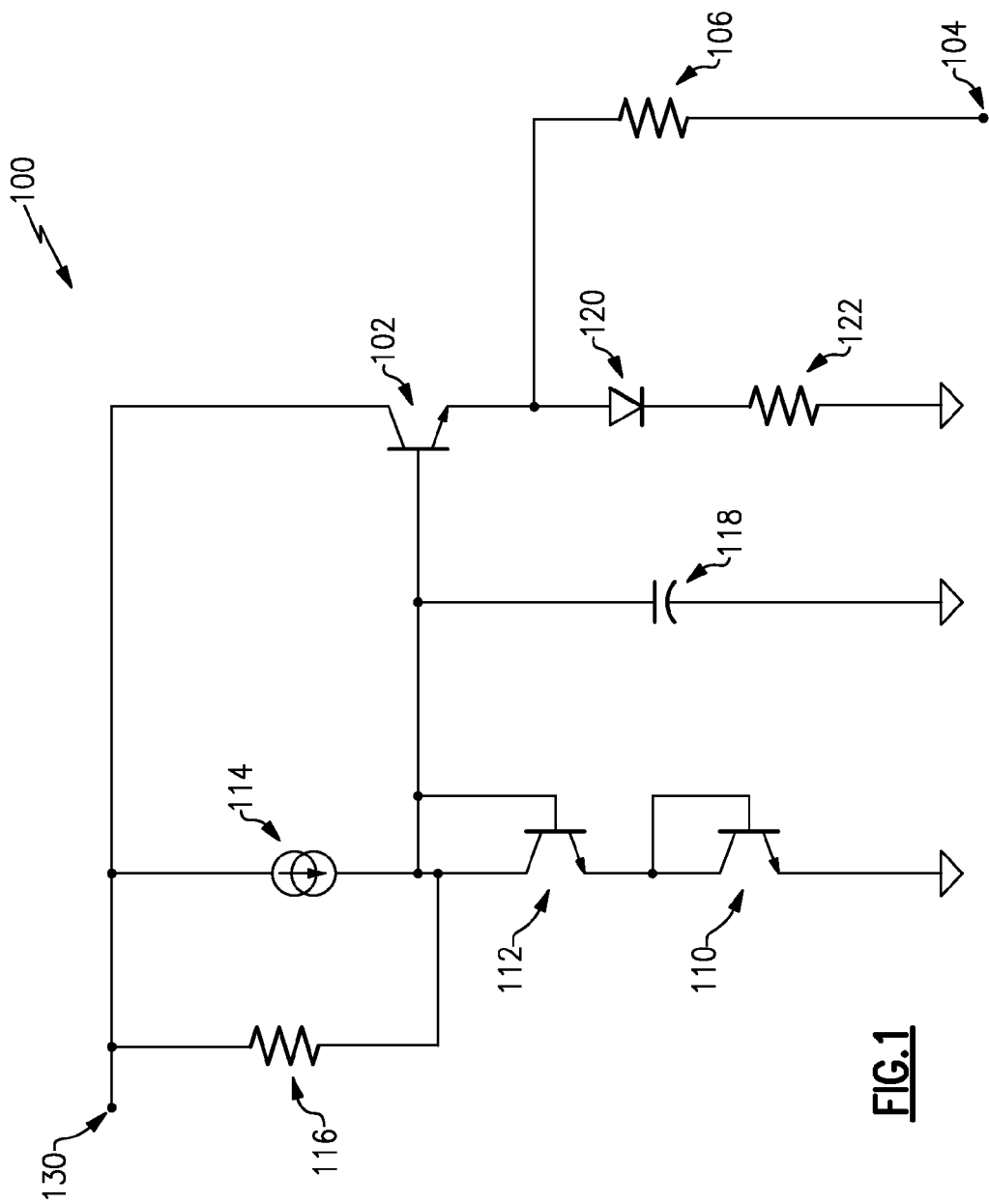
FIG. 1 illustrates a circuit diagram of an embodiment of a bias circuit with a common collector amplifier.

One aspect of the present disclosure relates to a bias circuit. This bias circuit may include a first Schottky diode that includes a cathode and an anode. The cathode may be in electrical communication with a power amplifier. The bias circuit may further include a field effect transistor (FET) with a source in electrical communication with the anode of the first Schottky diode. In addition, the bias circuit can include a bipolar junction transistor in electrical communication with the FET. The bipolar junction transistor may include a collector in electrical communication with a gate of the FET and a base in electrical communication with the source of the FET.

In some implementations, the FET is a common-drain amplifier. In some cases, the FET is a source follower. Further, the first Schottky diode may enable the bias circuit to operate using a voltage less than or equal to 2.5 volts. In certain embodiments, the first Schottky diode enables the bias circuit to operate using a voltage of 1.9 volts.

In some designs, the FET and the bipolar junction form a feedback loop. In some such cases, the bias circuit may further include a frequency compensation circuit to stabilize the feedback loop. The frequency compensation circuit may include a resistor and a capacitor forming an RC circuit.

Moreover, the bias circuit can include a reference current source. The reference current source may include a current source and a resistor. Moreover, the reference current source may be implemented separately from at least a portion of the bias circuit.

Some implementations of the bias circuit include a second Schottky diode in electrical communication with an emitter of the bipolar junction transistor. In some cases, a size of the first Schottky diode and a size of the second Schottky diode are selected such that a current density of the first Schottky diode and a current density of the second Schottky diode match. Moreover, a size of the bipolar junction transistor may be selected to match a size of a transistor of the power amplifier.

Another aspect of the present disclosure relates to a power amplifier module that includes a power amplifier and a bias circuit. The bias circuit may include a first Schottky diode that may include a cathode and an anode. The cathode can be in electrical communication with the power amplifier. The bias circuit may further include a field effect transistor (FET) with a source in electrical communication with the anode of the first Schottky diode. Moreover, the bias circuit can further include a bipolar junction transistor in electrical communication with the FET. This bipolar junction transistor can include a collector in electrical communication with a gate of the FET and a base in electrical communication with the source of the FET.

In some embodiments, the power amplifier module further includes a reference current circuit in electrical communication with the bias circuit. This reference current circuit may be implemented in silicon. The bias circuit may be implemented using gallium arsenide. Moreover, the power amplifier module may further include a power amplifier controller configured to set a bias operating current of the bias circuit. In some cases, the bias circuit further includes a frequency compensation circuit. Moreover, in some cases, the bias circuit further includes a second Schottky diode in electrical communication with an emitter of the bipolar junction transistor.

Yet another aspect of the present disclosure relates to a wireless device that includes a battery and a power amplifier module. The battery may provide a voltage to a bias circuit.

Further, the power amplifier module may include a power amplifier and the bias circuit. The bias circuit may include a first Schottky diode including a cathode and an anode. The cathode may be in electrical communication with the power amplifier. Further, the bias circuit can include a field effect transistor (FET) with a source in electrical communication with the anode of the first Schottky diode. In addition, the bias circuit may further include a bipolar junction transistor in electrical communication with the FET. The bipolar junction transistor may include a collector in electrical communication with a gate of the FET and a base in electrical communication with the source of the FET.

In some embodiments, the battery supplies 2.5 volts or less to the bias circuit. Further, the power amplifier module may further include a reference current circuit in electrical communication with the bias circuit. In some cases, the bias circuit further includes a second Schottky diode in electrical communication with an emitter of the bipolar junction transistor. Moreover, in some cases, the bias circuit further includes a compensation circuit in electrical communication between the gate of the FET and a base of the bipolar junction transistor.

DETAILED DESCRIPTION

One solution to the above described problem is to use an emitter follower circuit, which is sometimes referred to as a common collector amplifier. An example of this solution is illustrated in FIG. 1. As illustrated in FIG. 1, an amplifier 102 (e.g., a common collector amplifier) is positioned before the bias output node 104 that leads to a power amplifier (e.g., the power amplifier 332 of FIG. 3).

When including the common collector amplifier 102 in the circuit, the RF energy causes the amplifier 102 to rectify. In other words, the sinusoidal waveform of the RF may be distorted since the minimum voltage may be limited by the base-emitter junction voltage while the maximum voltage is generally not constrained. As a result, the magnitude of the RF swing may be converted to a DC voltage shift. Thus, when the RF energy leaking into the bias circuit is low, the voltage of base emitter junction of the amplifier 102 typically will not have much variance. However, if the RF energy that leaks into the bias circuit 100 is high, the base emitter voltage will be reduced. So, as the average current drain in the power amplifier increases, the bias voltage tends to decrease. This decreasing bias may be counteracted as the RF signal swing increases and the emitter follower voltage or Vef that is provided to the power amplifier increases. This increasing Vef helps expand the bias of the power amplifier and increase the gain.

The use of the emitter follower circuit for preventing degradation of the performance of the bias circuit is sometimes referred to as a 2Vbe solution because the PA typically has a base-emitter voltage of approximately 1.2 volts and the amplifier 102 typically has a base-emitter voltage of 1.2 volts resulting in a 2.4 voltage drop across the resister 106. The resistor 106 may be included for setting gain compression characteristics of the power amplifier in communication with the node 104. Typically, due to additional bias overhead and temperature variation, the voltage at the base of the amplifier 102 will be approximately 2.6 or 2.7 volts. This voltage is typically compensated for by the transistors 110 and 112 by running a current, from the current source 114, through the transistors 110 and 112 that enables the power amplifier to be biased at the 2Vbe voltage. Thus the bias point of the base of the amplifier 102 is 2Vbe.

The transistors 110 and 112 are configured to function as diodes by connecting the base and collectors together. Thus the transistors 110 and 112 may form a diode stack. The transistor 112 may be further configured to match the amplifier 102. Similarly, the transistor 110 is configured to match the power amplifier that is in electrical communication with the bias circuit 100 at the node 104. Matching the transistor 112 to the amplifier 102 and the transistor 110 to the power amplifier may include matching the diode junction voltages of the respective elements. For example, using a silicon process, the diode junction voltages may be configured to be 700 mV. For a heterojunction bipolar transistor (HBT), the base-emitter diode junction voltage is approximately 1.2 volts. Generally, a diode or transistor that is similar to the transistor of the power amplifier is used such that the diode voltage or base emitter voltage is equal and tracks from wafer to wafer.

Advantageously, in certain embodiments, by matching the transistor 112 to the amplifier 102 and the transistor 110 to the power amplifier, the impact of process variations during manufacture and temperature changes in the operating environment is reduced. Thus, consistent voltage and performance may be provided by the power amplifier.

The current source 114 may be formed using a pFET, or a p-channel Field-Effect Transistor. Usually a voltage of 300 mV is sufficient for the pFET to operate. The combination of the voltage across the pFET and the 2Vbe voltage is approximately 3 volts. Thus, it is typical to use a 3.5 volt power supply with a minimum operating voltage of 3 volts.

If the voltage drops below 300 mV, the pFET will act as a triode and will no longer operate in the active region. Further, it will be difficult to accurately control the current generated by the current source 114. This is not a problem for devices with 3.5 volt battery supplies. However, some manufacturers are working on new battery technologies that would operate at lower voltages including 2.5 volts and 2.3 volts. Thus, if the power amplifier is to operate with a power supply of 2.5 volts, and the 2Vbe bias stack is approximately 2.7 volts for a HBT configuration, not only is there no voltage for providing a current source, but the voltage is too low to generate the amplifier 102 base voltage.

As noted above, the voltage using silicon is 700 mV. Thus, the 2Vbe value for a bias circuit 100 using silicon is below 2.5 volts. However, silicon-based transistors typically do not provide as good performance as a circuit built using HBT because, for example, silicon tends to have a lower voltage breakdown, which may limit the RF power. Further, silicon tends to exhibit lower gain and poorer power added efficiency compared to materials used for creating HBT. Generally, HBT is created using gallium arsenide. However, other materials may be used, such as silicon germanium and gallium nitride. Generally, the circuits described herein may be used for bipolar transistor types. Further, the circuits described herein could be used with silicon enabling lower voltage for applications that do not require the improved performance of HBT. For example, some complementary metal oxide semiconductor (CMOS) applications may benefit from some embodiments disclosed herein because the diodes are often available for such applications, but the NPN transistors may not be available. For instance, silicon BiCMOS may support supply voltages as low as 1V using embodiments described herein while the 2Vbe bias may be limited to ~2V.

The bias circuit 100 may further include a diode 120 and a resistor 122 that functions to provide a DC bias to the emitter-follower, or common collector amplifier 102. Typically, the diode 120 is not a Schottky diode, but is instead a base collector junction diode. The base collector junction diode may be used because it generally has a lower junction voltage than the base emitter junction diode that may be used in the HBT process. Further, the bias circuit 100 may be powered by a voltage supply in communication with the node 130. Usually, the voltage supply is a battery (not shown) or other power supply of a device that includes the bias circuit 100, such as a mobile telephone, smartphone, tablet, video game system, television, laptop, or other computing or electronic system. However, in some cases, the bias circuit 100 may be powered by an alternate power supply, such as a localized power source that is separate from the device battery or a wall socket that is powering a device that includes the bias circuit 100.

The bias circuit 100 may also include a capacitor 118. This capacitor 118 prevents fluctuations in the base voltage of the amplifier 102 caused by the RF signal that leaks from the power amplifier onto the bias circuit 100. Often, a relatively large RF voltage (e.g., several volts) swing may be on node 104 as it is directly connected to the RF amplifier signal path. Thus, voltage may be conducted through resistor 106, which can act as a voltage divider with the resistor 106 working against the emitter impedance of the amplifier 102. The capacitor 118 can serve as a RF ground for the RF frequencies preventing the RF frequencies from altering the base voltage of the amplifier 102.

As is described further herein, one solution that reduces the required voltage of the bias circuit is to use Schottky diodes. In certain embodiments, the Schottky diode can be used as a substitute for at least some of the transistors of the bias circuit 100. Advantageously, in certain embodiments, by reducing the required voltage of the bias circuit, the required power supply can be reduced enabling the use of batteries with a lower voltage. In some cases, using batteries with a lower voltage enables the battery, and consequently the device to be shrunk compared to existing designs. Further, in some cases, using bias circuits that can operate at lower voltages can increase the battery life of devices.

Example Bias Circuit with Schottky Diode

Figure 2:
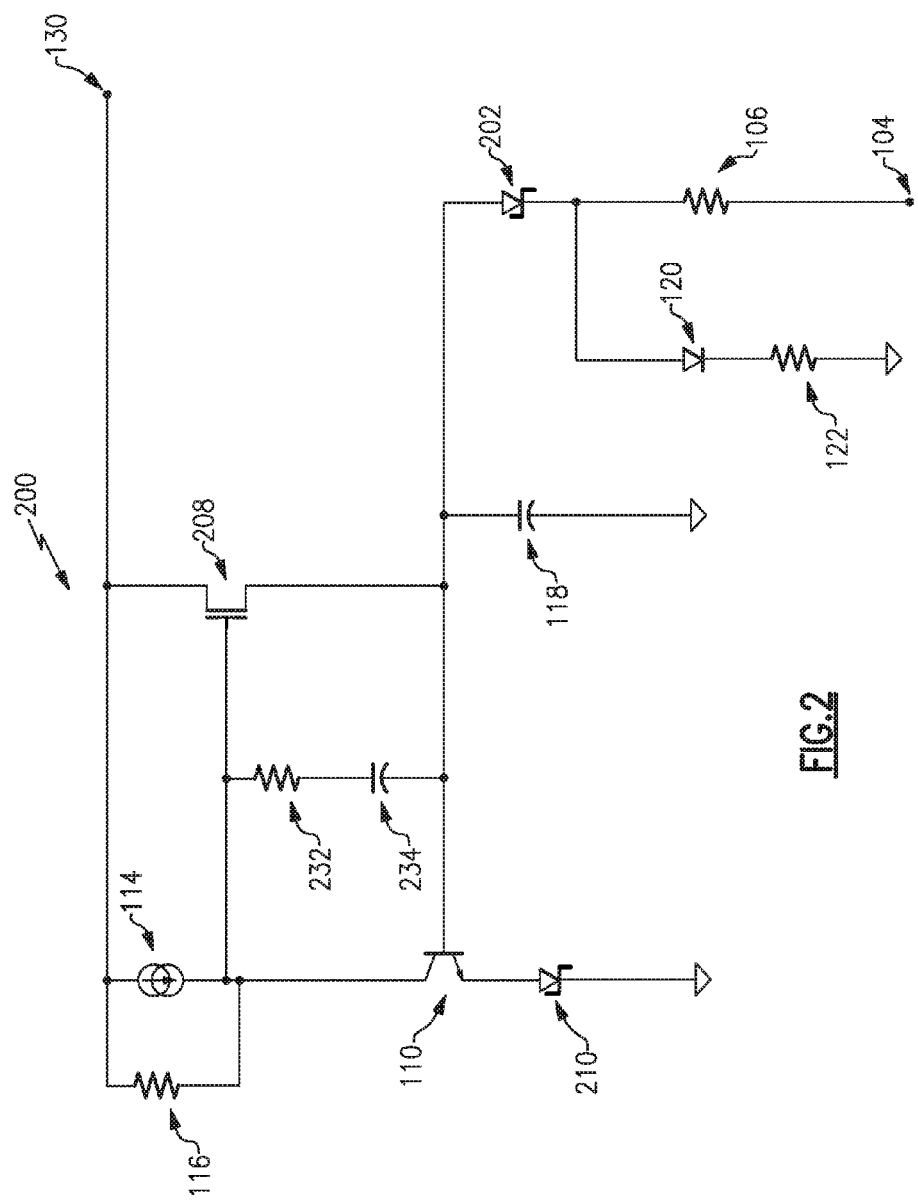
FIG. 2 illustrates a circuit diagram of an embodiment of a bias circuit with a Schottky diode.

FIG. 2 illustrates a bias circuit 200 that is capable of operating at lower voltages compared to the bias circuit 100 while maintaining the performance of the bias circuit 100. The bias circuit 200 can operate with a battery voltage of approximately 2 volts. Thus, the bias circuit 200 can be used in devices designed for 2.5 volt operation, in contrast to embodiments of the bias circuit 100.

The bias circuit 200 includes a number of circuit elements that, in some implementations, can be equivalent to elements of the bias circuit 100. These equivalent circuit elements share common reference numerals between the bias circuit 100 and the bias circuit 200. Further, the bias circuit 200 includes a number of additional circuit elements and a number of circuit elements that substitute for corresponding elements of the bias circuit 100.

The bias circuit 200 includes a Schottky diode 202 and a source follower or common-drain amplifier 208, which in combination can serve as a substitute for the amplifier 102 of the bias circuit 100. The source follower may be a field effect transistor (FET), and, in some cases, may be an n-channel device or a p-channel device, such as an NMOS or a PMOS, respectively. The amplifier 208 sources the DC current for the power amplifier through the resistor 106 to the node 104 that is in electrical communication with the power amplifier. The diode 202 provides the rectification functionality previously provided by the amplifier 102. In the bias circuit 100, the amplifier 102 is capable of both sourcing the DC current and rectifying the signal provided to the power amplifier. In the bias circuit 200, the functionality of the amplifier 102 is split between the amplifier 208 and the diode 202. However, the drain on the battery or voltage supply is reduced enabling the use of a smaller battery supply.

Typically a Schottky diode has a junction voltage potential of about 0.6 volts. Further, the amplifier 208 is generally an FET and may be formed using gallium arsenide or another FET process option. Moreover, the amplifier 208 may be a depletion mode FET. With the depletion mode FET, the gate voltage is pulled below the source voltage of the transistor to turn it off. Thus, the amplifier 208 is normally on. Further, the gate and source voltage of the amplifier 208 is close to 0 and, in some cases, can even be negative. Thus, by substituting the amplifier 102 with a Schottky diode and common-drain amplifier, the drain on the battery supply voltage, not including the current source 114, can be reduced from 2.4 volts to approximately 1.8 volts assuming an HBT implementation. Therefore, instead of the bias circuit having a 2Vbe voltage of 2.4 volts consisting of the amplifier 102 Vbe and the Vbe from the power amplifier in electrical communication at the node 104, the bias circuit can have a 1Vbe+diode voltage of approximately 1.8 volts. Moreover, the amplifier 208 may be a depletion device of about 200 mV and may exhibit a gate-source voltage of <0 in the active region. As a result the maximum gate voltage of the amplifier 208 may be calculated as the sum Vd+Vbe+Vgs, wherein Vd is the diode voltage. Thus, the maximum gate voltage may be 0.7+1.4−0.2=1.9 volts. Thus, the minimum required battery voltage can be reduced from 2.7 volts to 1.9 volts.

In the bias circuit 100, the collector and base of the transistors 110 and 112 are electrically connected together to form a pair of diodes as part of a diode stack. However, in the bias circuit 200, the collector and base of the transistor 110 is in electrical communication with the common-drain amplifier 208, which is a transistor with a gain characteristic and with bandwidth limitations. The collector and base of the amplifier 208 are connected together to form a feedback loop. Thus, if the voltage is pulled up on the base of the transistor 110 in the bias circuit 200, the collector voltage of the transistor 110 is pulled down and the feedback has the potential to oscillate. Therefore, the bias circuit 200 includes an RC circuit to introduce frequency compensation to stabilize the feedback loop between the transistor 110 and the common-drain amplifier 208. This RC circuit includes a resistor 232 and a capacitor 234. Inserting the RC circuit between the transistor 110 and the amplifier 208 is sometimes referred to as a Miller compensation technique and creates what is sometimes referred to as a Miller capacitance.

In some cases, the gain across the transistor 110 of the bias circuit 200 from the base to collector can be high (e.g., on the order of 300). The RC circuit compensates for the gain value by using a small capacitance (e.g., approximately 15 pF) that is positioned between the gate node of the amplifier 208 and ground, which creates a dominant pole that stabilizes the feedback between loop between the amplifier 208 and the transistor 110.

As the amplifier 102 from the bias circuit 100 is replaced with the combination of a Schottky diode 202 and common-drain amplifier 208, the transistor 112 that matched the amplifier 102 is similarly substituted with a Schottky diode 210 to match the diode 202. Although the transistor 112 is positioned between the base of the transistor 102 and the collector of the transistor 110 in FIG. 1, the Schottky diode that replaced the transistor 112 may be positioned between the emitter of the transistor 110 and ground.

In some cases, the current that flows in the power amplifier is greater than the current that flows in the transistor 112. As a result, it is often desirable to use different size Schottky diodes for the diodes 202 and 210. Typically, the diode 202 has a larger area than the diode 210. The area of the diodes is selected such that when a larger current flows to the power amplifier via the node 104, the resulting voltage across the diode 202 and the diode 210 is the same. In selecting the size of the diodes, an attempt is made to match the current density of the diode 202 and the diode 210. The diode voltage may be selected by using the equation Vt*In(Id/Is). Vt is the thermal voltage across the diode junction, which is usually 26 mV. Id represents the diode current and Is represents a constant that is a function of the diode area. The constant Is may change as a function of area of the junction of the diode. Thus, if the diode current Id is going to be double (e.g., 2×), then the area of the diode should be selected to be 2× to maintain the diode voltage. Thus, in certain embodiments, the diode may be selected such that the Is value will scale with the current density. Therefore, in certain embodiments, the size of the diodes 202 and 210 may be selected based on the formula for the diode voltage and a particular desired current density and/or using the desire to match the current density of the diodes 202 and 210 as a constraint.

Similarly, the transistor 110 is much smaller than the effective power amplifier array of the power amplifier. The power amplifier array generally is a parallel combination of multiple devices (e.g., transistors) resulting in a much greater current flow in the power amplifier compared to the transistor 110. However, the transistor 110 is usually selected to have the same amount of current flowing through it as through a single transistor of the power amplifier. The base emitter voltage of the transistor may be determined as Vbe=Vt*In(Ic/Is). Ic is the collector current through the device. Is is a constant that may vary along with the area of the base-emitter junction. Thus, if it is desired that the Vbe remains constant, if the current is doubled through the device, then the area of the device generally needs to double to account for the increase in the current term of the Vbe formula. Thus, the transistor 110 may be selected to maintain the same current per unit area as the power amplifier.

As with the bias circuit 100, the bias circuit 200 may include a diode 120 and resistor 122 that can function to provide a DC bias to the Schottky diode 202. Further, the bias circuit can include the resistor 106 for setting gain compression characteristics of the power amplifier in communication with the node 104.

Similar to the bias circuit 100, the bias circuit 200 may also include a capacitor 118, which serves a similar purpose to the inclusion of the capacitor in the bias circuit 100. The capacitor 118 of the bias circuit 200 serves as a RF ground for the RF frequencies preventing the RF frequencies from altering the voltage of the top node of the diode 202. The capacitor 118 can short or ground the top node of the diode 202 at the RF frequencies by absorbing the RF energy. The impedance of the capacitor can be represented by one over the capacitance times the frequency of the signal (e.g., 1/C*Fs). Thus, as the frequency of the RF signal increases, the impedance or effective resistance of the capacitor 118 drops. As a result, the capacitor 118 shunts the current to ground as the RF signal increases and maintains the voltage of the capacitor 118.

Figure 3:
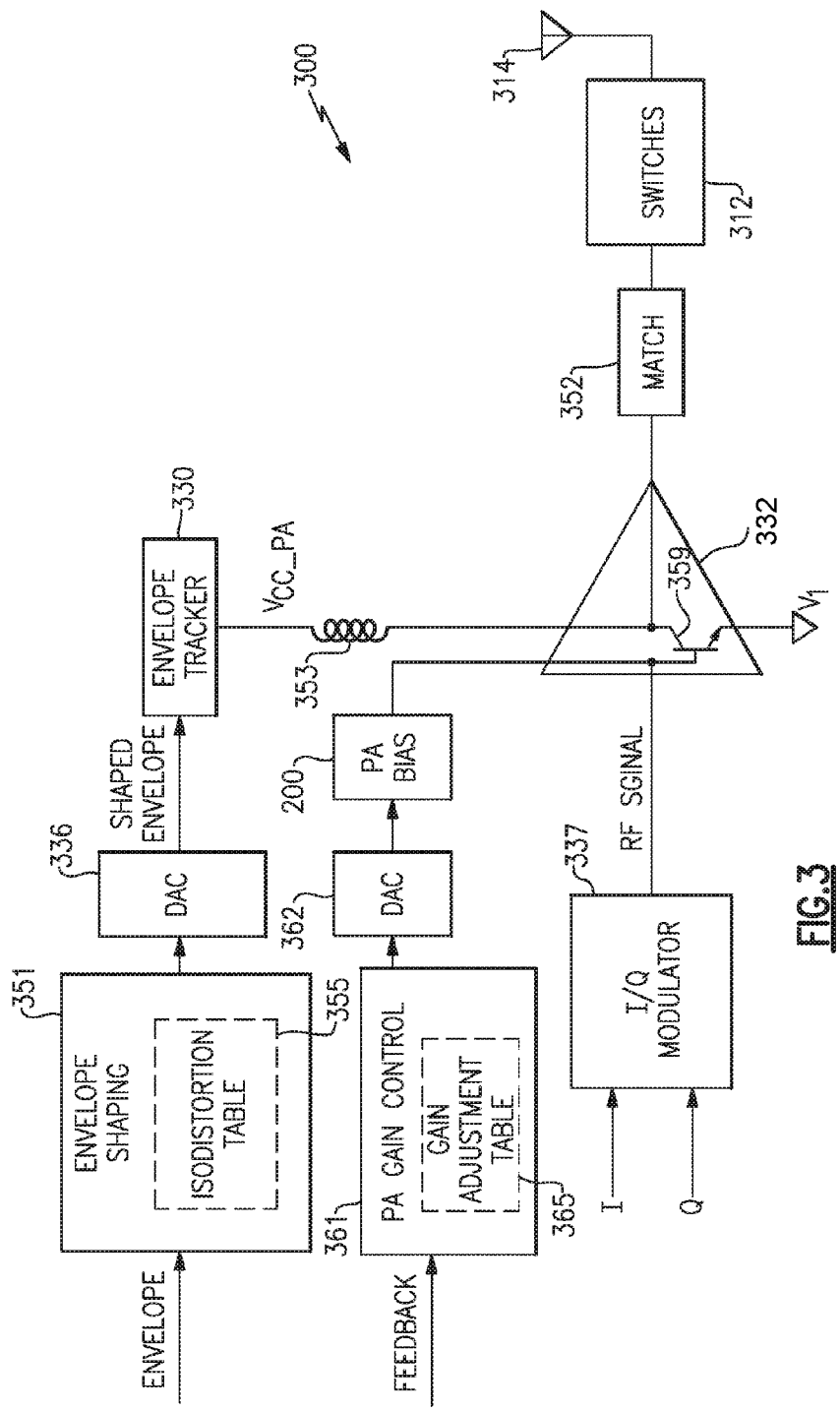
FIG. 3 is a circuit diagram of one embodiment of a power amplifier system.

Generally, the bias circuit 200 is integrated onto the same die as the power amplifier 332 as illustrated in FIG. 3. Advantageously, by integrating the bias circuit 200 onto the same die as the power amplifier 332, matching the transistor 110 to the power amplifier is simplified. In contrast, the current source 114, and associated resistor 116, is often on a separate die in the power amplifier module 440. Generally, the current source 114 and the resistor 116 are included on a silicon die that provides a reference current to the power amplifier. However, in some embodiments, the current source 114 and resistor 116 may be integrated on the same die as the power amplifier 332 and the bias circuit 200.

The bias circuit 200 sets the quiescent operating point for the power amplifier 332. The quiescent operating point generally refers to the DC operating point of the power amplifier without an RF signal. In many cases, the RF interference is used as a bias enhancement. However, the RF interference raises the required battery voltage for the bias circuit. Advantageously, the bias circuit 200 is capable of supporting a low battery voltage operation (e.g., 1.9-2 volts) while maintaining the RF bias enhancement characteristics. Further, in certain embodiments, the bias circuit 200 maintains a wide bandwidth and maintains the rectification effect of the 2Vbe bias circuit 100.

Example Power Amplifier System

FIG. 3 is a circuit diagram of one embodiment of a power amplifier system 300. The power amplifier system 300 includes the switches 312, the antenna 314, the envelope tracker 330, the power amplifier 332, the I/Q modulator 337, an envelope shaping circuit 351, a matching circuit 352, an inductor 353, first and second DACs 336, 362, a power amplifier gain control circuit 361, and a power amplifier bias circuit 200.

The envelope shaping circuit 351 includes an isodistortion table 355 and the power amplifier gain control circuit 361 includes a gain adjustment table 365. The envelope shaping circuit 351, the first DAC 336, and the envelope tracker 330 are associated with an envelope tracking system of the power amplifier system 300. In some embodiments, the envelope tracking system may be omitted from the power amplifier system 300. The power amplifier gain control circuit 361, the second DAC 362, and the power amplifier bias circuit 200 are associated with a gain control system of the power amplifier system 300.

The envelope shaping circuit 351 is configured to receive an envelope signal, and to shape the envelope signal using the isodistortion table 355 to generate a shaped envelope signal, which can be used by the envelope tracker 330 to control a voltage level of the power amplifier supply voltage $V_{CC\_PA}$. In certain implementations, the shaped envelope signal generated by the envelope shaping circuit 351 can be a digital signal. In such configurations, the first DAC 336 can be used to convert the digital shaped envelope signal into an analog shaped envelope signal, which the envelope tracker 330 can use to control the voltage level of the power amplifier supply voltage $V_{CC\_PA}$. In one embodiment, the isodistortion table 355 is implemented as a look-up table, such as a programmable memory. For example, the look-up table can receive a digital input signal indicating a voltage level of the envelope signal, and can generate a digital output signal indicating a voltage level of the shaped envelope signal.

The power amplifier gain control circuit 361 includes an input configured to receive a power feedback signal and an output configured to generate a power control signal for the power amplifier bias circuit 200 based on the gain adjustment table 365. In certain implementations, the shaped power control signal generated by the power amplifier gain control circuit 361 can be a digital signal. In such configurations, the second DAC 362 can be used to convert the digital gain control signal into an analog gain control signal, which can be used by the power amplifier bias circuit 200 to generate a bias signal that can control the power amplifier's gain.

Thus, the gain adjustment table 365 can be used to map a power feedback signal to a given power amplifier bias level, thereby controlling the power amplifier's gain. In certain implementations, the feedback signal is based in part on a sensed power of a directional coupler (not shown). At high power levels, the gain adjustment table 365 can increase the gain of the power amplifier 332, thereby relaxing a current/power requirement of the I/Q modulator 337. Additionally, in certain implementations, as the output power is decreased or backed-off the gain adjustment table 365 can reduce or buck the power amplifier's gain, thereby improving the efficiency of the amplifier.

In one embodiment, the gain adjustment table 365 is implemented as a look-up table, such as a programmable memory. For example, the look-up table can receive a digital input signal indicating a voltage level of a power feedback signal and can generate a digital output signal indicating a voltage level of a bias signal.

The I/Q modulator 337 is configured to receive an I signal and a Q signal and to generate a RF signal. In certain implementations, the I and Q signals can be provided to the I/Q modulator 337 in a digital format. The I/Q modulator 337 can be configured to receive the I and Q signals from a baseband processor, such as the baseband system 408 of FIG. 4, and to process the I and Q signals to generate an RF signal. For example, the I/Q modulator 337 can include DACs configured to convert the I and Q signals into an analog format, mixers for upconverting the I and Q signals to radio frequency, and a signal combiner for combining the upconverted I and Q signals into an RF signal suitable for amplification by the power amplifier 332. In certain implementations, the I/Q modulator 337 can include one or more filters configured to filter frequency content of signals processed therein.

The power amplifier 332 includes a bipolar transistor 359, which includes a base configured to receive the RF signal and a bias signal from the power amplifier bias circuit 200. This bipolar transistor 359 may be matched by the transistor 110, which in some cases may also be a bipolar transistor or bipolar junction transistor (BJT). In certain implementations, the bias signal can correspond to a base bias voltage and/or a base bias current. The bipolar transistor 359 further includes an emitter electrically connected to a ground or power low supply, and a collector configured to provide an amplified RF signal to the antenna 314 through the switches 312. The collector of the bipolar transistor 359 is also connected to the inductor 353, which is used to provide the power amplifier 332 with the power amplifier supply voltage $V_{CC\_PA}$ generated by the envelope tracker 330. The inductor 353 can be used to provide a low impedance to low frequency signal components, while choking or blocking high frequency signal components associated with the amplified RF signal. Alternatively, the power amplifier 332 may be powered by a battery source or alternative power generation or provisioning element.

The matching circuit 352 can be used to terminate the electrical connection between output of the power amplifier 332 and the switches 312. The matching circuit 352 can be used to provide a desired load line impedance of the power amplifier 332 at the fundamental frequency of the RF signal. In certain implementations, the matching circuit 352 can also be used to provide harmonic terminations, including, for example, a second harmonic short and/or a third harmonic open.

Conventional envelope tracking systems can maintain the linearity of a power amplifier by using a shaping table that can pre-distort the instantaneous gain of the power amplifier (AM/AM) to a substantially constant gain value or isogain. By implementing the envelope tracking system using an isogain table, the power amplifier can be linearized and distortion can be controlled to about the minimum value possible.

The power amplifier system 300 of FIG. 3 has been implemented based on a recognition that instantaneous isogain is not a requirement of a typical communications standard and that some distortion can be permitted to improve power added efficiency (PAE). For example, the isodistortion table 355 can reduce current consumption by controlling the power amplifier's supply voltage to a level sufficient to just provide the required linearity and receive distortion, thereby providing enhanced PAE at low input power levels. Although the isodistortion table 355 can distort the RF signal, the distortion provided can be selected to be less than a maximum distortion permitted by a particular communications standard. Since there is a tradeoff between distortion and linearity, the isodistortion table 355 can increase distortion but enhance PAE.

In certain implementations, the isodistortion table 355 is used to map or convert data indicating the voltage of the envelope signal into data indicating the voltage of the shaped envelope signal to maintain substantially constant distortion. The isodistortion table 355 can maintain a substantially constant distortion in a transmit band and/or a receive band across voltage changes in the envelope signal, and can be calibrated at a particular power level. In one embodiment, the isodistortion table 355 is configured such that the power amplifier's distortion changes by less than about −38 decibels relative to carrier (dBc) for the transmit band and −130 decibel-milliwatt per hertz (dBm/Hz) for the receive band dB over the envelope signal's range.

The isodistortion table 355 can be calibrated for a particular power level (such as an output power level) and for a particular linearity and receive distortion. The isodistortion table 355 can operate optimally for the calibrated output power level but performance can fall off at high average output power as the gain of the power amplifier 332 is compressed to meet compression criteria. To achieve a given output power in these conditions, the I/Q modulator 337 can increase the power of the RF signal provided to the power amplifier 332. However, the I/Q modulator 337 can also work harder when increasing the RF signal's power, and hence can significantly increase the total current of the system. Additionally, when the output power level of the power amplifier system 300 is less than that of the calibrated power level of the isodistortion table 355, the average gain of the power amplifier can be higher than a gain required by the system, which can increase the current required from the battery.

To improve overall PAE, the power amplifier system 300 includes not only the isodistortion table 355, but also the gain adjustment table 365 for increasing the gain of the power amplifier at high power levels to reduce a power/current requirement of the I/Q modulator 337 driving the power amplifier 332. The gain adjustment table 365 can increase or boost the power amplifier's gain for at least a portion of the power levels greater than the calibration power level that the isodistortion table 355 is calibrated at.

Additionally, in certain implementations the gain adjustment table 365 can decrease the gain of the power amplifier at power levels less than the calibration power level that the isodistortion table 355 is calibrated at. Although increasing the gain of the power amplifier 332 can decrease the power amplifier's efficiency in isolation, the overall combined efficiency of the power amplifier 332 and the I/Q modulator 337 can be increased.

In the illustrated configuration, the gain of the power amplifier 332 is adjusted by controlling a bias of the bipolar transistor 359 using the power amplifier bias circuit 200. For example, the power amplifier bias circuit 200 can be used to control a base current and/or base voltage of the bipolar transistor 359, thereby controlling the power amplifier's gain. However, other configurations are possible. Additionally, although the power amplifier system 300 is illustrated in the context of a single stage configuration, the teachings herein are applicable to multi-stage configurations in which the gain of one or more of the stages is adjusted using the power amplifier bias circuit 200.

Example Wireless Device

Figure 4:
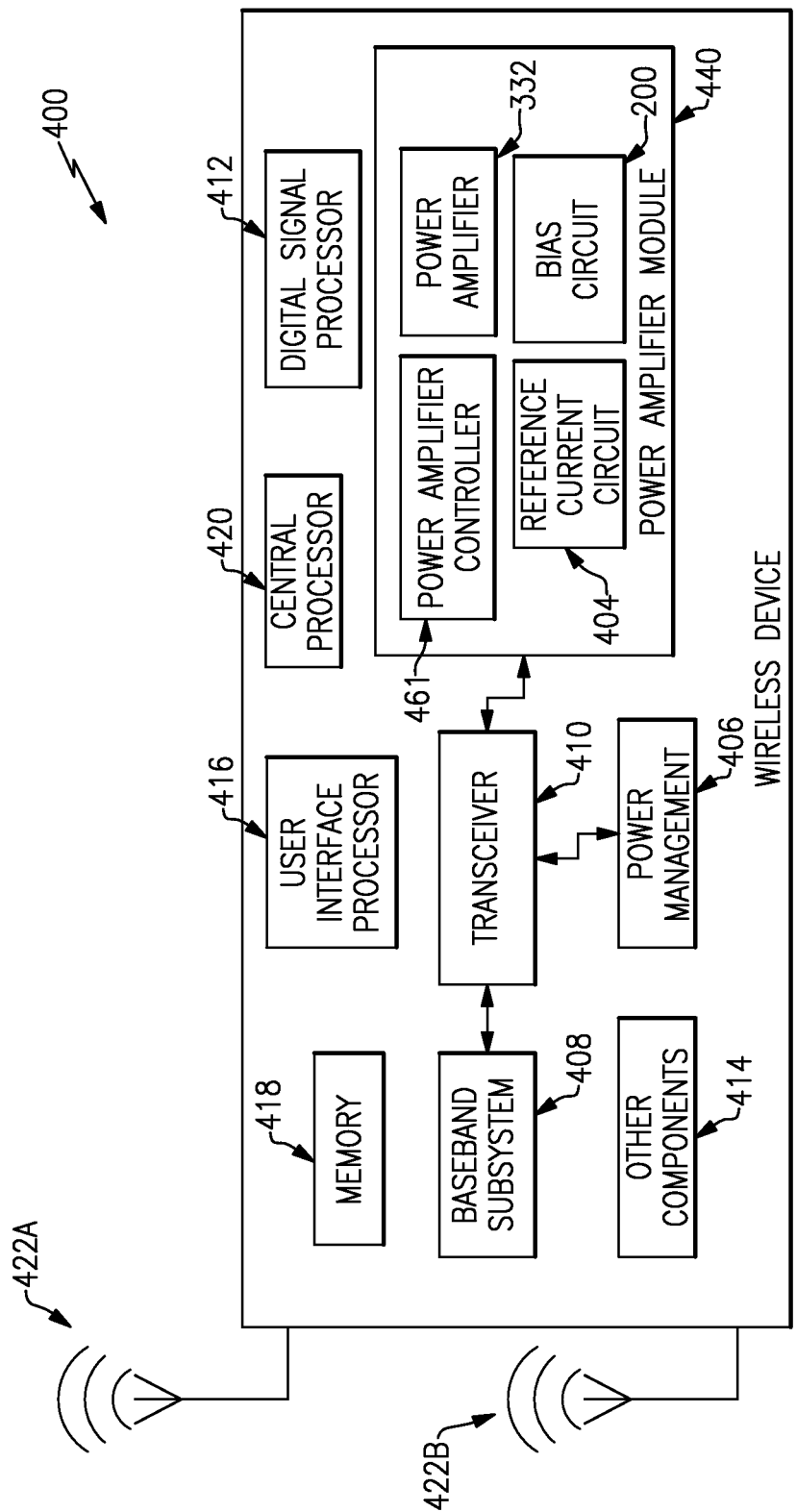
FIG. 4 illustrates a block diagram of a wireless device including a power amplifier module.

FIG. 4 illustrates an embodiment of a wireless device 400 that may include one or more power amplifier modules 440. Although the wireless device 400 illustrates only one power amplifier module (PAM), it is possible for the wireless device 400 to include a number of PAMs, each of which may or may not be of the same configuration as PAM 440. Further, the wireless device 400 may include some of or all of the components described with respect to FIG. 3 as part of power amplifier module 440.

The power amplifier module 440 can include a number of elements. These elements may include, for example, a power amplifier 332, a power amplifier controller 461, a reference current circuit 404, and a bias circuit 200. Each of these power amplifier module elements may be implemented on the same circuit die. Alternatively, at least some of the elements of the power amplifier module 440 may be implemented on a different element circuit die. Advantageously, by implementing elements on a different circuit die, different semiconductor technologies may be used for different circuit elements of the power amplifier module 440. For example, the bias circuit 200 may be implemented using gallium arsenide (GaAs) technology while the reference current circuit may be implemented using silicon (Si).

The PAM 440 may include a power amplifier controller 461 that may be used to set and/or configure the PA 332 of the PAM 440. In some cases, the power amplifier controller 461 may include or may be replaced by the PA gain control 361. Further, certain implementations of the power amplifier module 440 may omit the power amplifier controller 461. For example, the power amplifier 332 may include the power amplifier controller 461 on-chip or integrated with the power amplifier 332. In some embodiments, the PAM 440 may include multiple PAs, which may share the PA controller 461 or which may each be associated with its own power amplifier controller. The PA 332 can facilitate, for example, multi-band operation of the wireless device 400. The mode of the power amplifier 332 may, in some cases, be set by the power amplifier controller 461 based on a signal and/or mode selection set by the power amplifier module 440 or from a transceiver.

In some embodiments, the power amplifier controller 461 may set the operating point for the PA 332 by modifying the bias circuit 200. For instance, the power amplifier controller 461 may set or modify a bias current provided by the bias circuit 200 to the PA 332.

The power amplifier 332 may include any type of power amplifier. Further, the power amplifier may be set to operate at a particular operating point. This operating point may be configured by the bias circuit 200, which may provide a bias current and/or voltage to the power amplifier 332.

The reference current circuit 404 may be configured to provide a reference current to one or more elements of the power amplifier module 440. For example, the reference current circuit 404 may provide a reference current to the bias circuit 200. In some implementations, the reference current circuit 404 may include the current source 114 and the resistor 116. Further, the reference current circuit 404 may be implemented separately from the bias circuit 200 and, in some cases, may be implemented using a different semiconductor material and/or process than the bias circuit 200. Alternatively, the reference current circuit 404 may be of the same material as the bias circuit 200. In some such cases, the reference current circuit 404 may be included with the bias circuit 200 as part of a single circuit die.

In some cases, the PAM 440 can receive RF signals from a transceiver 410 that can be configured and operated in known manners to generate RF signals to be amplified and transmitted, and to process received signals. The transceiver 410 is shown to interact with a baseband subsystem 408 that is configured to provide conversion between data and/or voice signals suitable for a user and RF signals suitable for the transceiver 410. The transceiver 410 may also be connected to a power management component 406 that is configured to manage power for the operation of the wireless device. Such power management can also control operations of the baseband sub-system 408 and the PAM 440. It should also be understood that the power management component 406 may include a power supply, such as a battery. Alternatively, or in addition, one or more batteries may be separate components within the wireless device 400.

Other connections between the various components of the wireless device 400 are possible, and are omitted from FIG. 4 for clarity of illustration only and not to limit the disclosure. For example, the power management component 406 may be electrically connected to the baseband subsystem 408, the PAM 440, the DSP 412, or other components 414. As a second example, the baseband subsystem 408 may be connected to a user interface processor 416 that may facilitate input and output of voice and/or data provided to and received from the user. The baseband sub-system 408 can also be connected to a memory 418 that may be configured to store data and/or instructions to facilitate the operation of the wireless device 400, and/or to provide storage of information for the user.

In addition to the aforementioned components, the wireless device may include one or more central processors 420. Each central processor 420 may include one or more processor cores. Further, the wireless device 400 may include one or more antennas 422A, 422B. In some cases, one or more of the antennas of the wireless device 400 may be configured to transmit and receive at different frequencies or within different frequency ranges. Further, one or more of the antennas may be configured to work with different wireless networks. Thus, for example, the antenna 422A may be configured to transmit and receive signals over a 2G network, and the antenna 422B may be configured to transmit and receive signals over a 3G network. In some cases, the antennas 422A and 422B may both be configured to transmit and receive signals over, for example, a 2.5G network, but at different frequencies.

A number of other wireless device configurations can utilize one or more features described herein. For example, a wireless device does not need to be a multi-band device.

In another example, a wireless device can include additional antennas such as diversity antenna, and additional connectivity features such as Wi-Fi, Bluetooth, and GPS. Further, the wireless device 400 may include any number of additional components, such as analog to digital converters, digital to analog converters, graphics processing units, solid state drives, etc. Moreover, the wireless device 400 can include any type of device that may communicate over one or more wireless networks and that may include a PA 332 and/or PAM 440. For example, the wireless device 400 may be a cellular phone, including a smartphone or a dumbphone, a tablet, a laptop, a video game device, a smart appliance, etc.

Comparison Simulations

Simulations of the bias circuit 100 and the bias circuit 200 were performed. The following section compares various characteristics of the operation of the bias circuit 100 and the bias circuit 200 based on the performed simulations.

Figure 5:
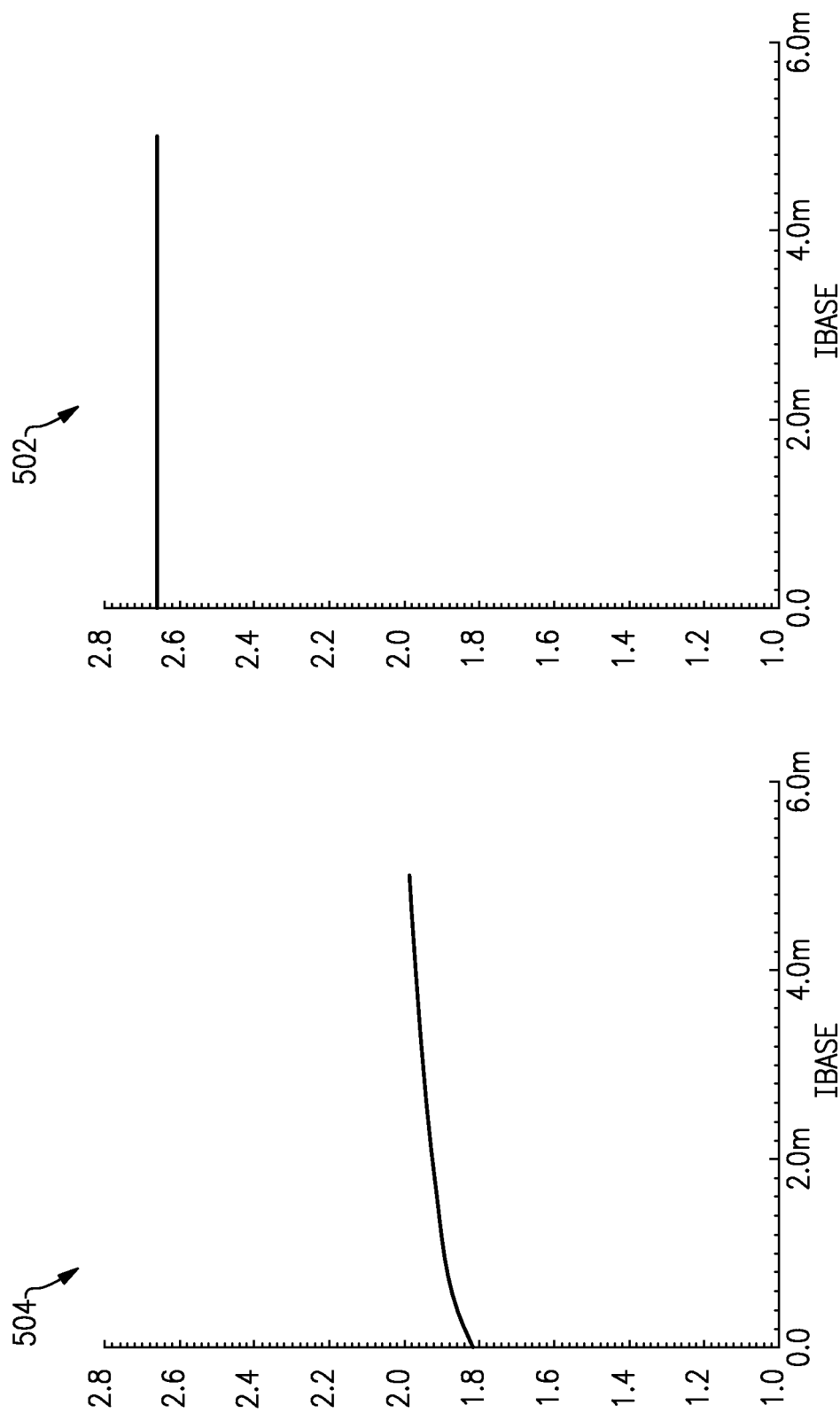
FIG. 5 illustrates a pair of graphs comparing the voltage at a current source of the bias circuits of FIG. 1 and FIG. 2.

FIG. 5 illustrates a pair of graphs of the voltage at the current source 114 for a simulation of the bias circuit 100 and a simulation of the bias circuit 200. The graph 502 on the right represents the bias circuit 100 and the graph 504 on the right represents the bias circuit 200. As can be seen by the graph 502, the voltage as measured at the current source 114 is approximately 2.7 volts. This voltage is the voltage value presented to the current source (e.g., at the gate of transistor 208 or the base of transistor 102). Generally, the battery voltage minus the voltage presented to the current source is required to be 300 mV or more. As illustrated in the graph 502, this voltage value appears steady between 0 and 5 mA for the current source 114. On the other hand, the voltage value gradually increases for the bias circuit 200 between 0 and 5 mA. However, at its highest point, the voltage of the bias circuit 200 at the current source 114 of 5 mA is approximately 2 volts. Thus, in the worst case, the bias circuit 200 reduces the required battery voltage by 700 to 800 mV and thus, enables the use of a smaller battery. For instance, while the bias circuit 100 may be used with a battery of at least 3 volts in size, the bias circuit 200 can be used in devices that have a 2.5 volt battery, or smaller (e.g., 2 to 2.3 volts in some cases).

The voltages measured during the simulations were for a device at 30 degrees C. It should be understood that at warmer temperatures, it may be possible to further reduce the required battery voltage. For example, simulations of the bias circuit 100 at 85 degrees C. resulted in a voltage range measured at the current source 114 of approximately 2.2 volts. In comparison, the simulations of the bias circuit 200 at 85 degrees C. resulted in a voltage range measured at the current source 114 of approximately 1.3 volts with both simulations varying depending on the process corners used during the simulations. However, for both the graphs 502 and the graph 504, the worst case is illustrated for temperature and process corner. Thus, in the worst case, the bias circuit 200 reduced the battery voltage approximately 700 to 800 mV compared to the bias circuit 100.

Figure 6:
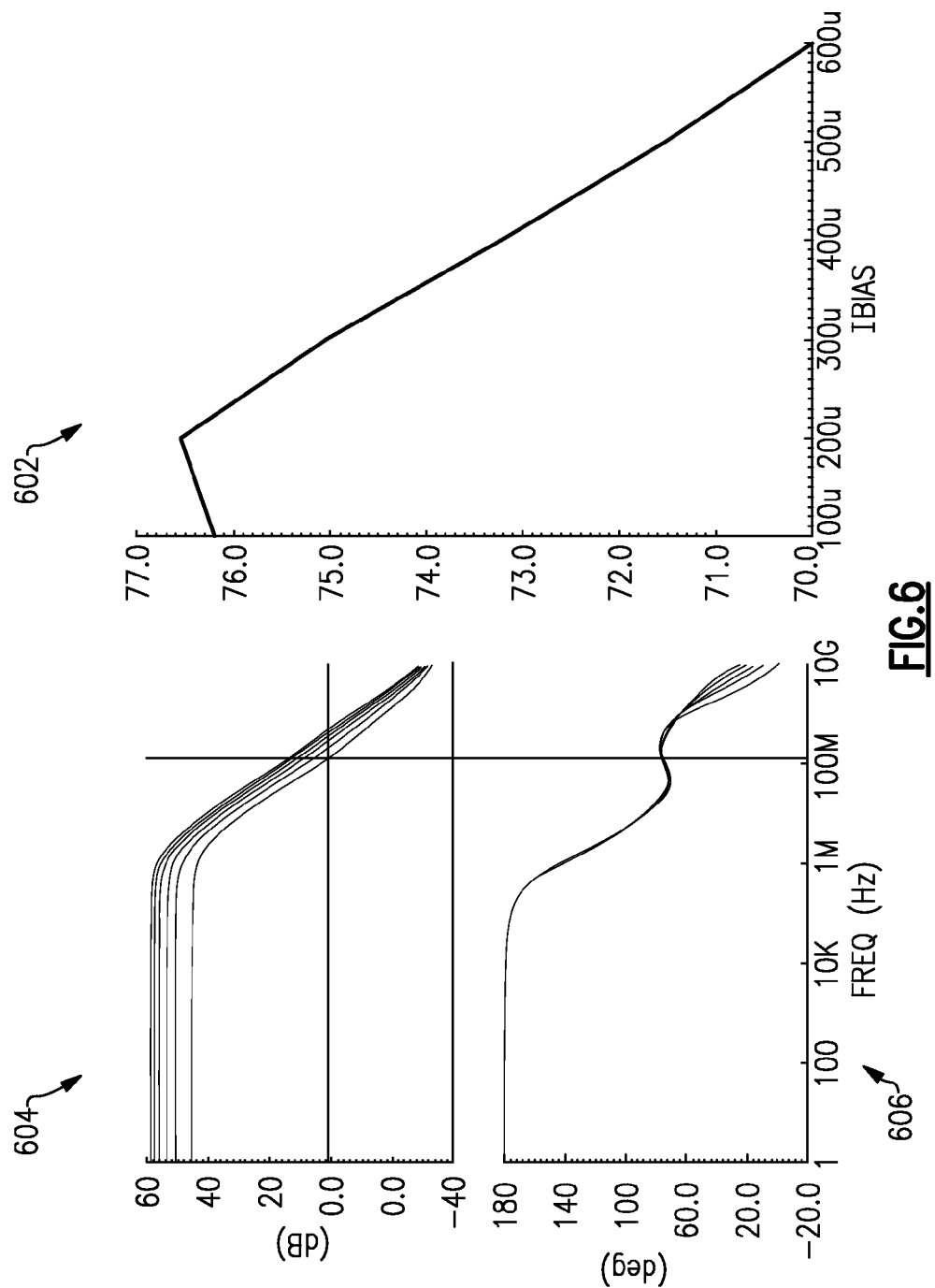
FIG. 6 illustrates a set of graphs illustrating that a feedback loop in the bias circuit of FIG. 2 is stabilized by an RC circuit.

FIG. 6 includes a set of graphs illustrating that the feedback loop is stabilized by the RC circuit that includes the resistor 232 and the capacitor 234. The graph 602 illustrates that the phase margin is above 70 degrees. The graphs 604 and 606 are Bode plots that illustrate that when the gain is zero, the phase remains above 45 degrees (e.g., approximately 75 degrees). The plots 604 and 606 represent the open loop gain and phase around the feedback loop formed by the transistors 110 and 208. The phase margin (e.g., the phase shift at unity gain) is evaluated as the bias is swept to ensure acceptable stability margin for this feedback loop. Typically, anything below 45 degrees is considered unacceptable. Thus, it is evident from the graphs 604 and 606 that the stability response is acceptable. Further, as the gain reaches 0 at approximately 100 MHz, the bias circuit 200 will have a bias bandwidth up to approximately 100 MHz.

Figure 7:
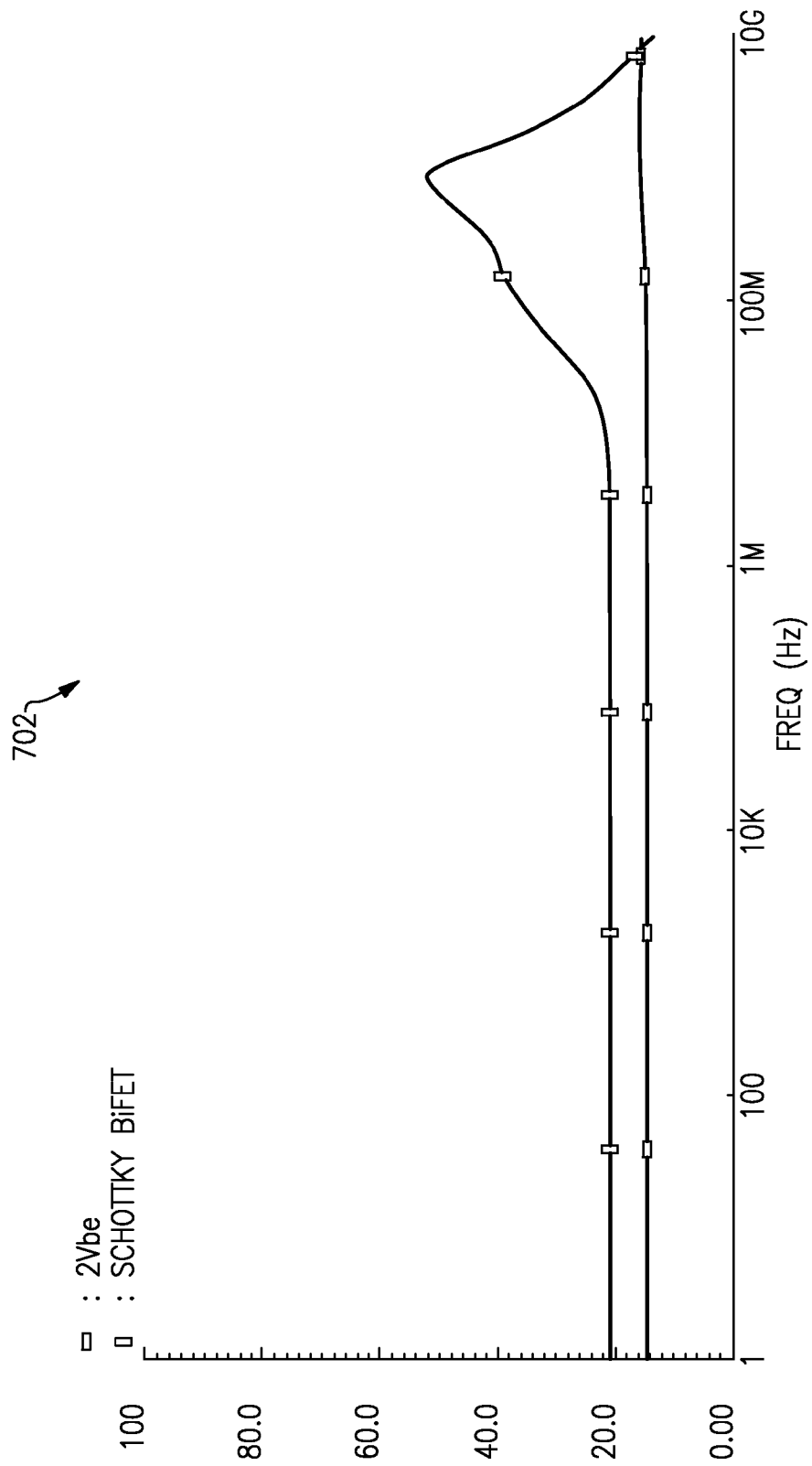
FIG. 7 illustrates a logarithmic graph comparing an output impedance of the bias circuit of FIG. 1 to an output impedance of the bias circuit of FIG. 2.

FIG. 7 illustrates a logarithmic graph 702 comparing the output impedance of the bias circuit 100 and the bias circuit 200. The lower line represents the output impedance of the bias circuit 100. As can be seen from the graph 702, the bias circuit 100 has a low impedance out to 10 GHz. The bias circuit 200, the top line on the graph 702, has a low impedance up to approximately 20 MHz. However, the impedance begins to rise shortly after 20 MHz. Thus, the simulated bias circuit 200 as illustrated may be less effective at higher bandwidths compared to the bias circuit 100. In certain embodiments, it is possible to increase the bandwidth at which the bias circuit 200 is usable.

One solution to improve the bandwidth of the bias circuit 200 is by modifying the values of the RC circuit in the feedback loop between the amplifier 208 and the transistor 110. Another solution is to add additional RC circuits in parallel to the RC circuit illustrated in FIG. 2. By adding additional RC circuits in parallel, additional zeroes are introduced into the system that can cancel out poles. This approach enables the bias circuit bandwidth to extend to between 40 and 80 MHz in some cases thereby enabling the bias circuit 200 solution to be used for Long-Term Evolution (LTE) advanced, carrier aggregation, and 5G communications networks, among others.

Figure 8:
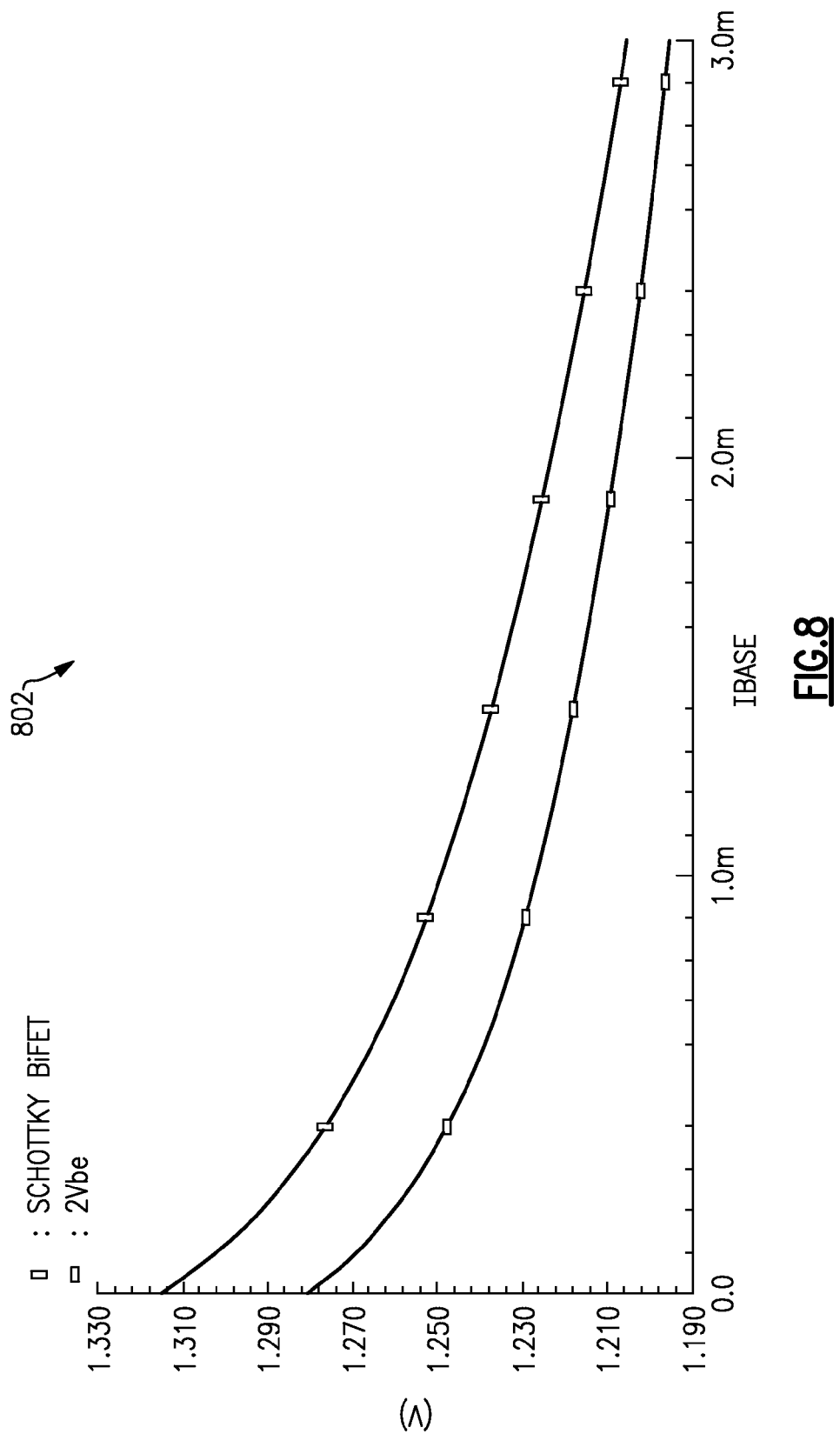
FIG. 8 illustrates a graph comparing the voltage generated by the bias circuits of FIGS. 1 and 2 for different current values.

FIG. 8 illustrates a graph 802 comparing the voltage generated by the bias circuits 100 and 200 for different current values. As with the graph 702, the top line is for the bias circuit 200 and the bottom line is for the bias circuit 100. As can be seen from the graph 802, the difference between the voltages generated by the two bias circuits is small with the biggest difference at any current value being approximately 30 mV.

Figure 9:
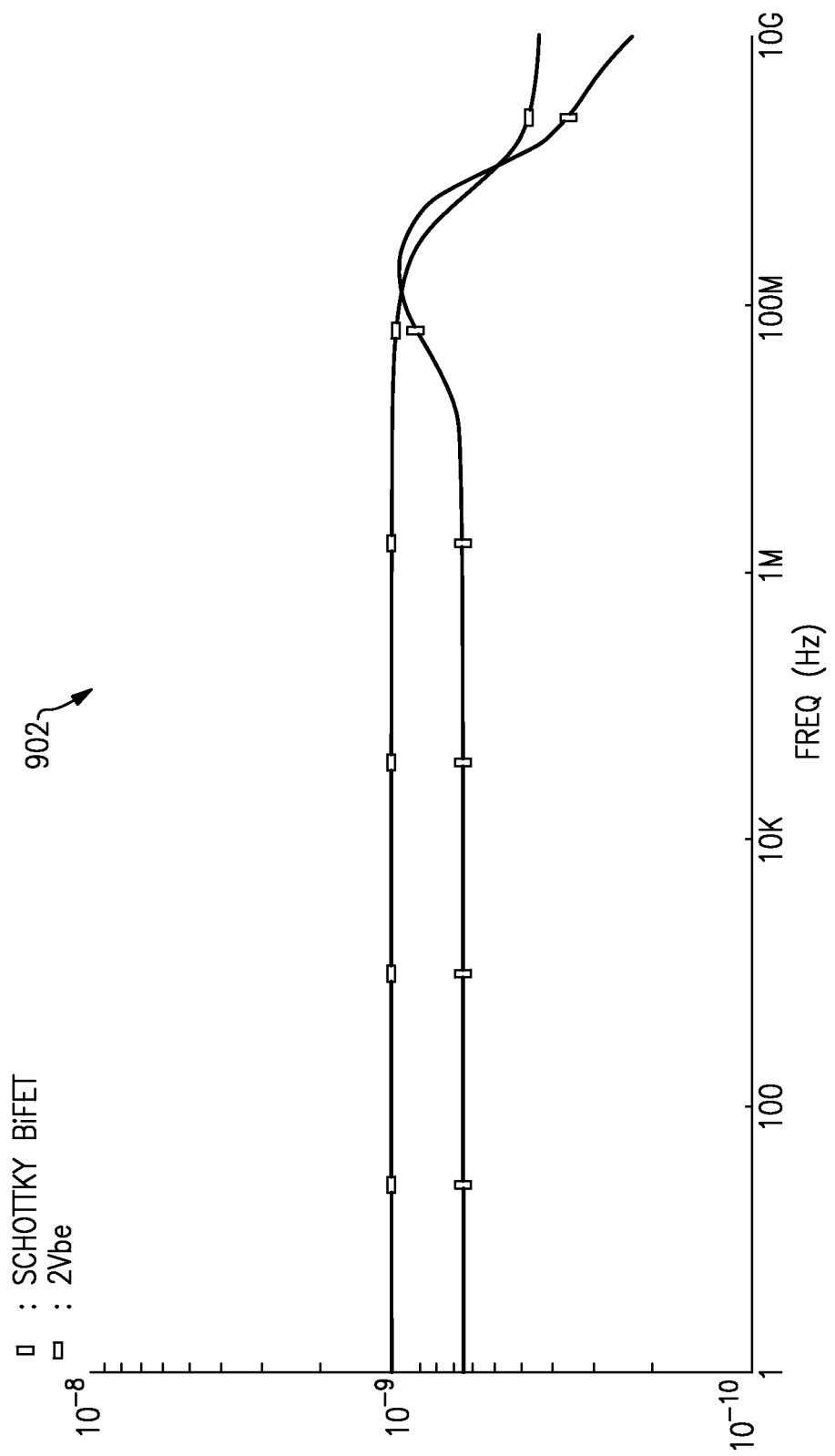
FIG. 9 illustrates a graph depicting the noise performance of the bias circuits of FIGS. 1 and 2.

FIG. 9 illustrates a graph 902 depicting the noise performance of the two bias circuits. The top line (beginning from the left of the graph 902) represents the bias circuit 100 and the bottom line represents the bias circuit 200. As illustrated by the graph 902, the bias circuit 200 has an improved noise performance compared to the bias circuit 100 for most frequencies.

Figure 10:
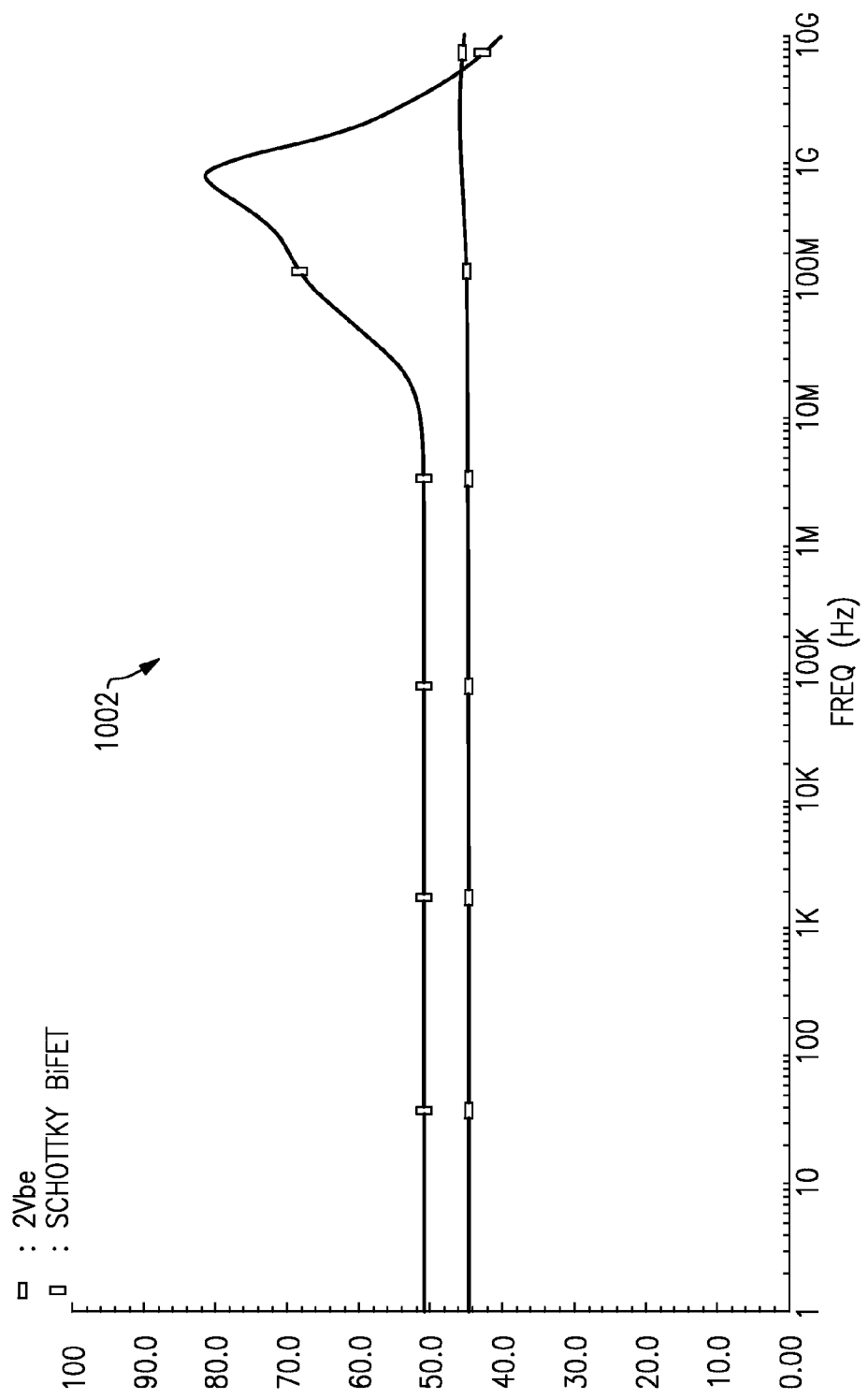
FIG. 10 illustrates a logarithmic graph comparing an output impedance of the bias circuit of FIG. 1 with an output impedance of the bias circuit of FIG. 2 as measured from a power amplifier.

FIG. 10 illustrates a logarithmic graph 1002 comparing the output impedance of the bias circuit 100 and the bias circuit 200 as measured from the power amplifier that is in electrical communication with the bias circuits at the node 104. The graph 1002 is similar to the graph 702. However, the increasing impedance of the bias circuit 200 (represented by the top line in the graph 1002) at higher frequencies reduced the RF loading. Thus, advantageously, the losses introduced by the bias circuit on the power amplifier are reduced using the bias circuit 200. In effect, the Schottky diode 202 of the bias circuit 200 functions as an inductance or choke at higher frequencies.

Figure 11:
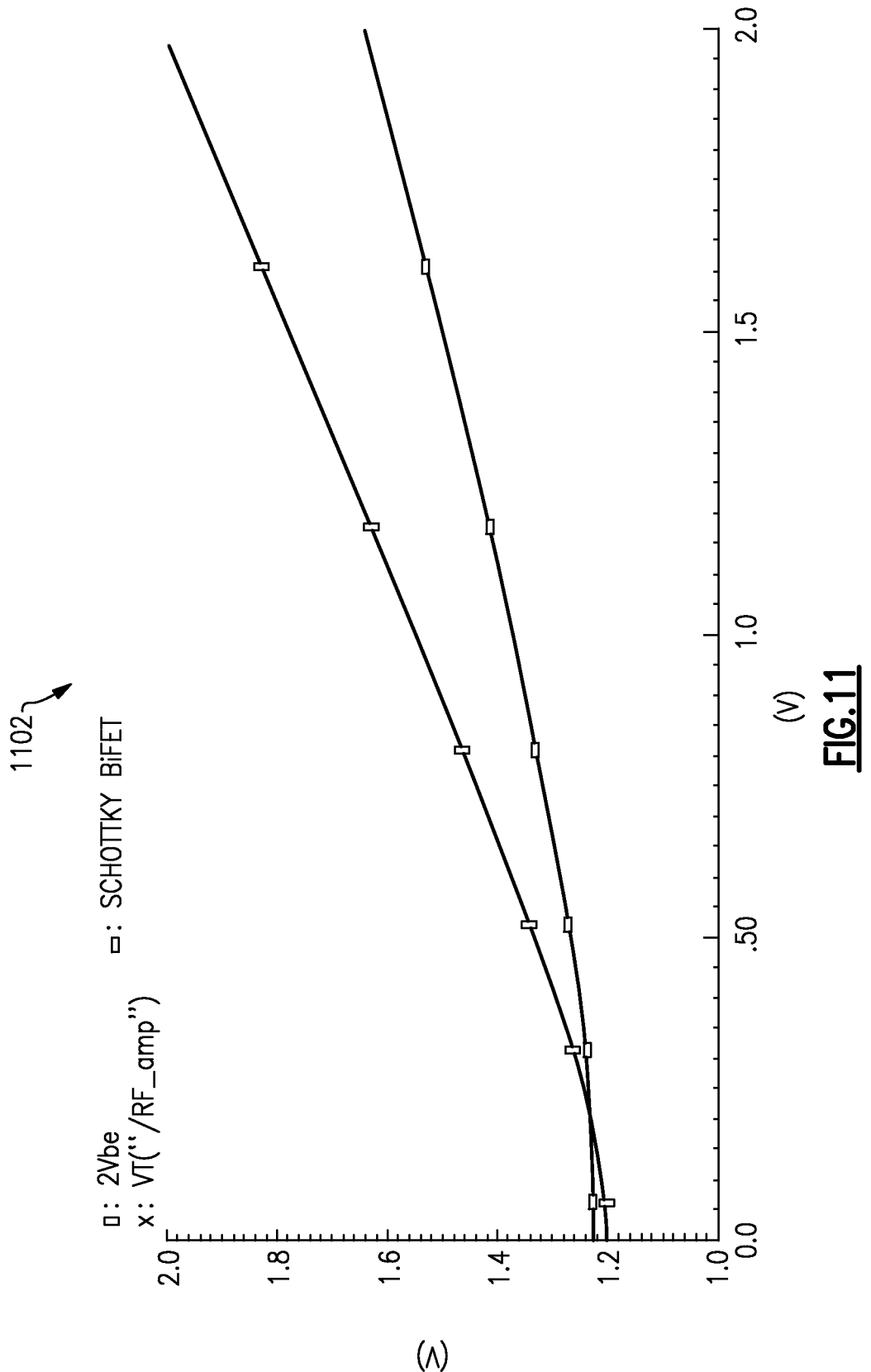
FIG. 11 illustrates a graph illustrating the impact on the bias voltage for the bias circuits of FIGS. 1 and 2 as the RF voltage signal increases.

FIG. 11 illustrates a graph 1102 illustrating the impact on the bias voltage as the RF voltage signal increases. Ideally, as the RF signal increases, the bias voltage should increase. The bias circuit 200 is represented by the lower line in the graph 1102. As illustrated by the graph, modifying the bias circuit as described herein to function with a lower battery voltage maintains the desired characteristic of increasing RF energy resulting in increasing bias voltage.

TERMINOLOGY

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A bias circuit comprising:
   a first Schottky diode including a cathode and an anode, the cathode in electrical communication with a power amplifier;
   a field effect transistor with a source in communication with the anode of the first Schottky diode;
   a bipolar junction transistor in communication with the field effect transistor, the bipolar junction transistor including a collector in communication with a gate of the field effect transistor and a base in communication with the source of the field effect transistor, the field effect transistor and the bipolar junction forming a feedback loop; and
   a frequency compensation circuit to stabilize the feedback loop.

2. The bias circuit of claim 1 wherein the field effect transistor is a common-drain amplifier.

3. The bias circuit of claim 1 wherein the first Schottky diode enables the bias circuit to operate using a voltage less than or equal to 2.5 volts.

4. The bias circuit of claim 1 wherein the frequency compensation circuit includes a resistor and a capacitor forming a resistor capacitor circuit.

5. The bias circuit of claim 1 wherein a size of the bipolar junction transistor is selected to match a size of a transistor of the power amplifier.

6. A bias circuit comprising:
   a first Schottky diode including a cathode and an anode, the cathode in electrical communication with a power amplifier;
   a field effect transistor with a source in communication with the anode of the first Schottky diode;
   a bipolar junction transistor in communication with the field effect transistor, the bipolar junction transistor including a collector in communication with a gate of the field effect transistor and a base in communication with the source of the field effect transistor; and
   a reference current source, the reference current source including a current source and a resistor.

7. The bias circuit of claim 6 wherein the reference current source is implemented separately from at least a portion of the bias circuit.

8. A bias circuit comprising:
   a first Schottky diode including a cathode and an anode, the cathode in electrical communication with a power amplifier;
   a field effect transistor with a source in communication with the anode of the first Schottky diode;
   a bipolar junction transistor in communication with the field effect transistor, the bipolar junction transistor including a collector in communication with a gate of the field effect transistor and a base in communication with the source of the field effect transistor; and
   a second Schottky diode in communication with an emitter of the bipolar junction transistor.

9. The bias circuit of claim 8 wherein a size of the first Schottky diode and a size of the second Schottky diode are selected such that a current density of the first Schottky diode and a current density of the second Schottky diode match.

10. A power amplifier module comprising:
a power amplifier; and
a bias circuit including a first Schottky diode and a second Schottky diode, the first Schottky diode including a cathode and an anode, the cathode in electrical communication with the power amplifier, the bias circuit further including a field effect transistor with a source in communication with the anode of the first Schottky diode, and the bias circuit further including a bipolar junction transistor in communication with the field effect transistor, the bipolar junction transistor including a collector in communication with a gate of the field effect transistor and a base in communication with the source of the field effect transistor, the second Schottky diode in communication with an emitter of the bipolar junction transistor.

11. The power amplifier module of claim 10 further comprising a reference current circuit in communication with the bias circuit.

12. The power amplifier module of claim 11 wherein the reference current circuit is implemented in silicon and the bias circuit is implemented using gallium arsenide.

13. The power amplifier module of claim 10 further comprising a power amplifier controller configured to set a bias operating current of the bias circuit.

14. A wireless device comprising:
a battery providing a voltage to a bias circuit; and
a power amplifier module including a power amplifier and the bias circuit, the bias circuit including a first Schottky diode and a second Schottky diode, the first Schottky diode including a cathode and an anode, the cathode in electrical communication with the power amplifier, the bias circuit further including a field effect transistor with a source in communication with the anode of the first Schottky diode, and the bias circuit further including a bipolar junction transistor in communication with the field effect transistor, the bipolar junction transistor including a collector in communication with a gate of the field effect transistor and a base in communication with the source of the field effect transistor, the second Schottky diode in communication with an emitter of the bipolar junction transistor.

15. The wireless device of claim 14 wherein the power amplifier module further includes a reference current circuit in communication with the bias circuit.

16. A wireless device comprising:
a battery providing a voltage to a bias circuit; and
a power amplifier module including a power amplifier and the bias circuit, the bias circuit including a first Schottky diode including a cathode and an anode, the cathode in electrical communication with the power amplifier, the bias circuit further including a field effect transistor with a source in communication with the anode of the first Schottky diode, and the bias circuit further including a bipolar junction transistor in communication with the field effect transistor, the bipolar junction transistor including a collector in communication with a gate of the field effect transistor and a base in communication with the source of the field effect transistor, the bias circuit further including a compensation circuit in communication between the gate of the field effect transistor and a base of the bipolar junction transistor.

* * * * *